(12) United States Patent  (10) Patent No.: US 7,528,576 B2
Ukon  (45) Date of Patent: May 5, 2009

(54) BATTERY REMAINING DISPLAY APPARATUS INCLUDING BATTERY REMAINING ESTIMATION UNIT

(75) Inventor: Tsutomu Ukon, Kuwana (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 385 days.

(21) Appl. No.: 11/339,539

(22) Filed: Jan. 26, 2006

(65) Prior Publication Data

US 2006/0164039 A1 Jul. 27, 2006

(30) Foreign Application Priority Data

Jan. 26, 2005 (JP) ............... 2005-018693

(51) Int. Cl.
*H01M 10/46* (2006.01)

(52) U.S. Cl. ....................................... 320/132

(58) Field of Classification Search ................ 320/107, 320/114, 115, 132, 149; 324/426, 430, 433; 702/63
See application file for complete search history.

(56) References Cited

U.S. PATENT DOCUMENTS

| 4,931,737 | A | 6/1990 | Hishiki |
| 5,248,929 | A | 9/1993 | Burke |
| 5,619,117 | A | 4/1997 | Koenck |
| 5,717,312 | A | 2/1998 | Maeda et al. |
| 6,630,814 | B2 | 10/2003 | Ptasinski et al. |
| 7,171,186 | B2 * | 1/2007 | Miyachi et al. .......... 455/343.5 |
| 2003/0069704 | A1 * | 4/2003 | Bean .................... 702/63 |

FOREIGN PATENT DOCUMENTS

| CN | 89104053.6 A | 2/1990 |
| CN | 01820819.3 A | 4/2004 |
| JP | 2 309742 | 12/1990 |
| JP | H07239373 A | 2/1994 |
| JP | H08-293328 A | 11/1996 |
| JP | 9 233711 | 9/1997 |
| JP | 2003-101466 A | 4/2003 |

OTHER PUBLICATIONS

European Patent Office, European Search Report for Related EP Application No. 06250449 dated May 30, 2006.
State Intellectual Property Office, Notification of the First Official Action in Chinese Patent Appl'n No. 2006100029698 (counterpart to the above-captioned U.S. patent application), mailed May 9, 2008.
Japanese Patent Office, Office Action (partial translation) for Japanese Patent No. 2005-018693 (counterpart to above-captioned U.S. patent application), issued Jun. 3, 2008.

* cited by examiner

*Primary Examiner*—Edward Tso
(74) *Attorney, Agent, or Firm*—Baker Botts L.L.P.

(57) ABSTRACT

A battery remaining display apparatus including: a battery capable of being charged and discharged; a use history storage unit that stores use history information about the battery; a characteristic information storage unit that stores characteristic information about the battery; a battery remaining estimation unit that estimates a remaining amount of the battery based on the use history information stored by the use history storage unit and the characteristic information stored by the characteristic information storage unit; and a display unit that displays the remaining amount of the battery estimated by the battery remaining estimation unit.

9 Claims, 7 Drawing Sheets

REMAINING DISPLAY: 3

FIG. 5B

REMAINING DISPLAY: 2

FIG. 5C

REMAINING DISPLAY: 1

FIG. 5D

REMAINING DISPLAY: 0

FIG. 6

BATTERY REMAINING DISPLAY APPARATUS INCLUDING BATTERY REMAINING ESTIMATION UNIT

CROSS REFERENCE TO RELATED APPLICATION

This application claims priority from Japanese Patent Application No. 2005-018693, filed on Jan. 26, 2005, the entire subject matter of which is incorporated herein by reference.

TECHNICAL FIELD

Aspects of the present invention relate to a battery remaining display apparatus, etc., which displays the remaining amount of a secondary battery capable of being charged and discharged.

BACKGROUND

As a conventional battery remaining display apparatus, an apparatus in which a terminal voltage of a battery is measured and based on its measured value, the remaining amount of the battery is estimated and the estimated remaining amount of the battery is displayed by a pictograph (pictogram) has been known (for example, see JP-A-9-233711). In this technique, a battery voltage measurement part for measuring a terminal voltage of a battery measures a battery voltage periodically and when a measured value of the present point in time is smaller than a measured value measured in the past at the time of normal use, display of the remaining amount of the battery is updated. And when a measured value of the present point in time is larger than a measured value measured in the past at the time of charging, display of the remaining amount of the battery is updated. That is, a difference between battery characteristics at the time of charging and discharging is considered and the remaining amount of the battery can be displayed more accurately.

SUMMARY

In the case where the technique as described above is incorporated into an apparatus having a voltage stabilization circuit, a terminal voltage of a battery becomes constant due to the voltage stabilization circuit at the time of charging, so that a problem that a change in the terminal voltage cannot be measured and the remaining amount of the battery cannot be correctly displayed arises. As one of measures to solve this problem, it is conceivable to incorporate a current stabilization circuit, but this results in upsizing of the battery remaining display apparatus and results in a cost increase or an increase in power consumption.

Aspects of the invention provide a technique capable of displaying the remaining amount of a battery more accurately while suppressing upsizing of a battery remaining display apparatus to a minimum even in the apparatus having a voltage stabilization circuit.

According to an aspect of the invention, there is provided a battery remaining display apparatus including: a battery capable of being charged and discharged; a use history storage unit that stores use history information about the battery; a characteristic information storage unit that stores characteristic information about the battery; a battery remaining estimation unit that estimates a remaining amount of the battery based on the use history information stored by the use history storage unit and the characteristic information stored by the characteristic information storage unit; and a display unit that displays the remaining amount of the battery estimated by the battery remaining estimation unit.

The "use history of the battery" herein is at least one history of charging and discharging of the battery, and more specifically is, for example, discharging time, charging time, discharging power energy, charging power energy, etc. Also, the "characteristic information about the battery" mainly means characteristic information about charging and discharging of the battery, and more specifically means, for example, information about a ratio between discharging power energy and the remaining amount of the battery or information about a ratio between discharging time and necessary charging time, etc.

In such a battery remaining display apparatus, battery remaining estimation unit estimates the remaining amount of the battery using the use history of the battery, so that a conventional problem occurring in the case of combining the battery remaining display apparatus with an apparatus having a voltage stabilization circuit can be avoided. That is, even when it is difficult to use measurement information about a terminal voltage of the battery at the time of charging, the remaining amount of the battery can be estimated using the use history of the battery. Also, an electronic circuit used for storing the use history of the battery can be implemented by a general-purpose small circuit (such as RAM) that is small compared with a current stabilization circuit, so that upsizing of the battery remaining display apparatus can also be suppressed.

Therefore, according to the battery remaining display apparatus, the remaining amount of the battery can be displayed more accurately while suppressing upsizing of the apparatus to a minimum even in the case of having the voltage stabilization circuit.

BRIEF DESCRIPTION OF THE DRAWINGS

Illustrative aspects of the invention may be more readily described with reference to the accompanying drawings.

DETAILED DESCRIPTION

Aspects of the invention will be described below with reference to the drawings. Incidentally, the invention is not limited to the following aspects and various forms can be adopted as long as the aspects belong to the technical scope of the invention.

Figure 1:
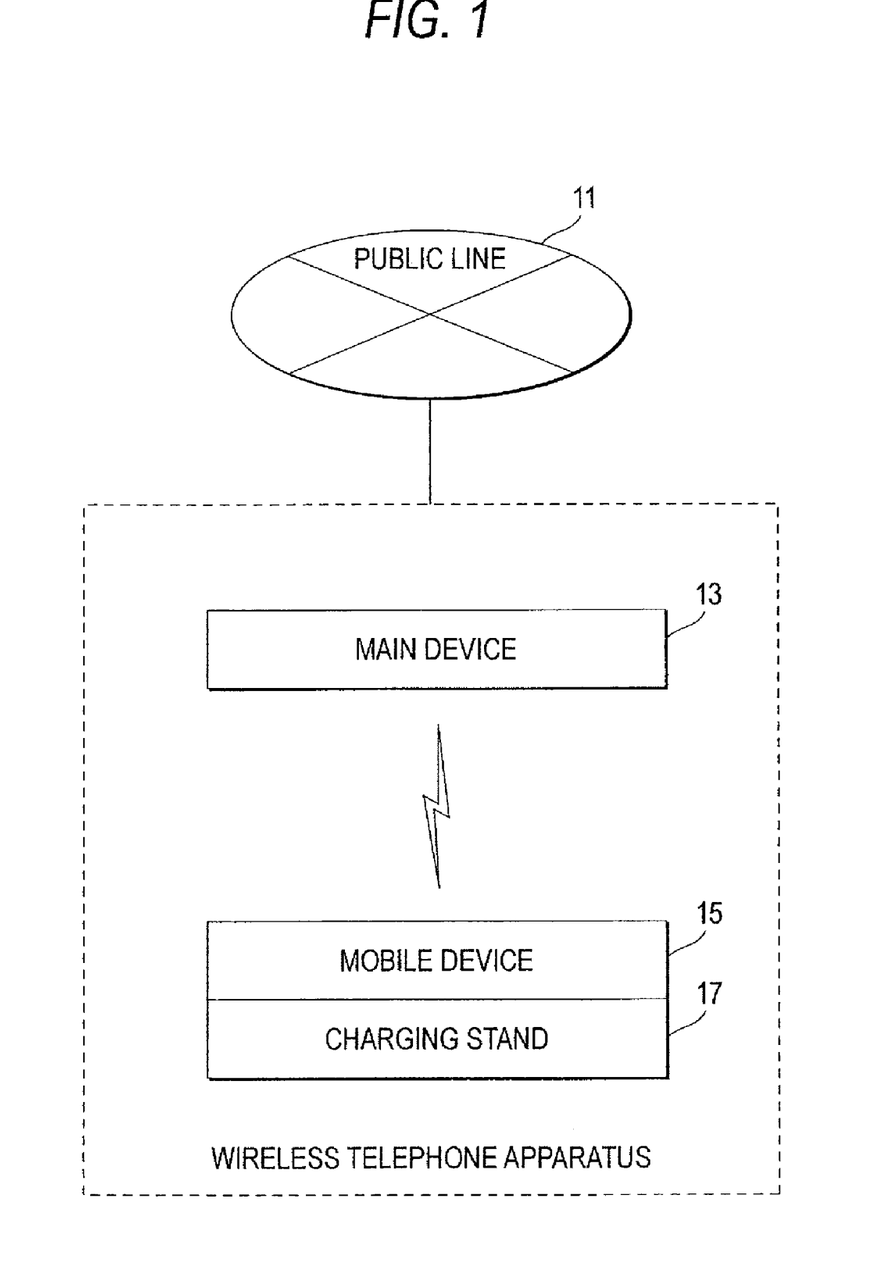
FIG. 1 is a block diagram showing the whole configuration of an aspect of the invention.

FIG. 1 is a block diagram showing the whole configuration of the present aspect. The aspect is constructed of at least a public line 11 and a wireless telephone apparatus 12 connected to the public line 11. This public line 11 is a public switched telephone network of a line switching type called PSTN and plural telephone sets (not shown) are connected.

The wireless telephone apparatus 12 is mainly constructed of a main device 13, a mobile device 15 for communicating with this main device 13 by radio waves, and a charging stand 17 for charging the mobile device 15. Incidentally, a technique of a battery remaining display apparatus according to an aspect of the invention is applied to this mobile device 15. Next, an internal configuration of this mobile device 15 and the charging stand 17 will be described with reference to a block diagram of FIG. 2.

Figure 2:
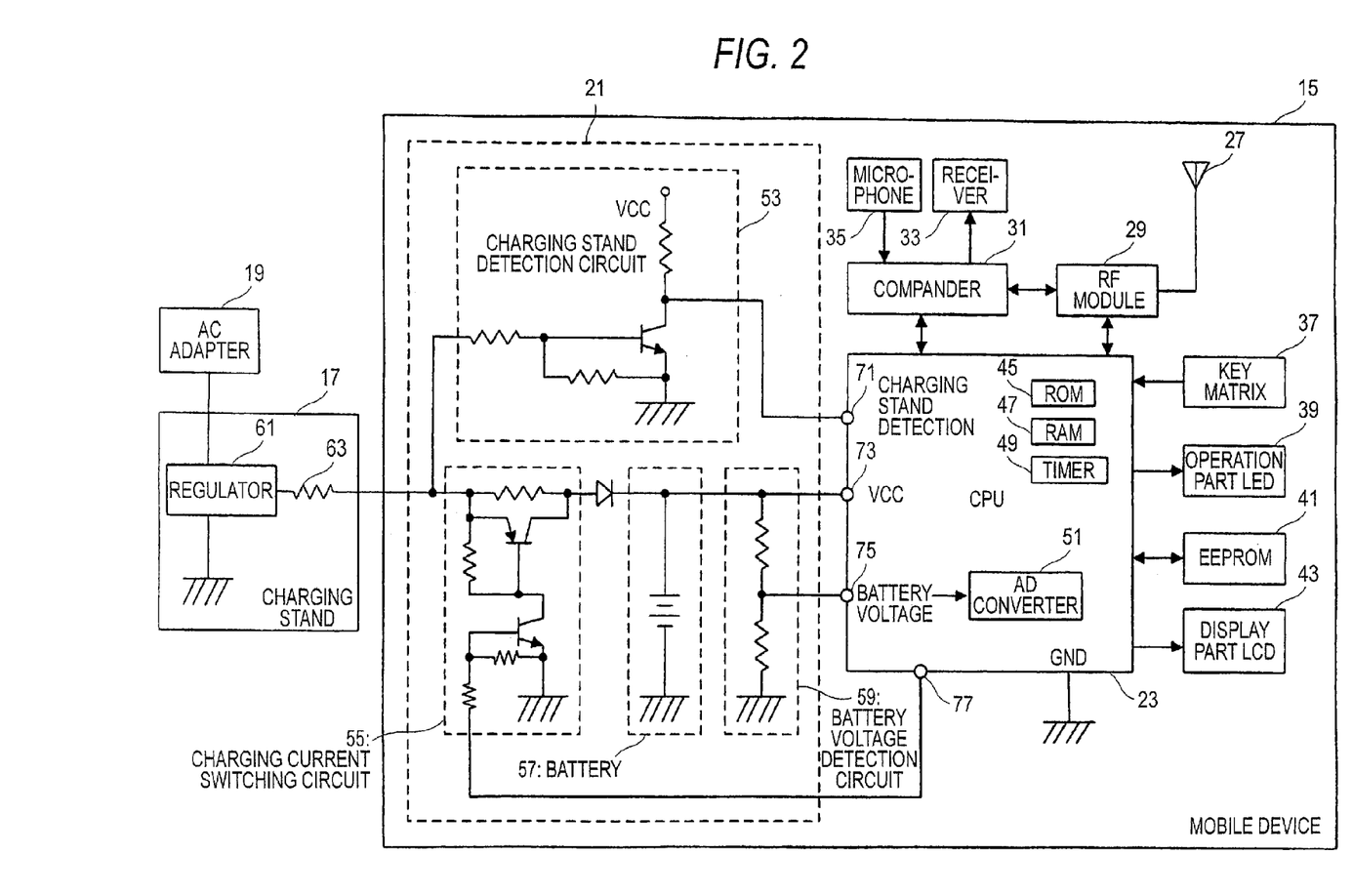
FIG. 2 is a block diagram showing an internal configuration of a mobile device.

As shown in FIG. 2, the mobile device 15 mainly includes a charging part 21, a CPU 23, an antenna 27, an RF module 29, a compander 31, a receiver 33, a microphone 35, a key matrix 37, an operation part LED 39, EEPROM 41, and a display part LCD 43. On the other hand, the charging stand 17 includes a regulator 61 for converting an AC current (7 V) outputted from an AC adapter 19 into a DC current (4.3 V), and a short-circuit protection resistor 63 for protecting a failure of the regulator 61 when the DC current outputted from the regulator 61 is short-circuited.

The charging part 21 which the mobile device 15 has includes a charging stand detection circuit 53 for making the CPU 23 detect whether or not the mobile device 15 is placed on the charging stand 17, a charging current switching circuit 55 for switching the current amount supplied from the charging stand 17 by the CPU 23, a battery 57 for supplying electric power to each part of the mobile device 15, and a battery voltage detection circuit 59 for making the CPU 23 detect a voltage of the battery 57. Incidentally, the charging current switching circuit 55 can switch a current from the charging stand 17 at two stages (large: the time of normal charging, small: the time of trickle charging) by an output voltage from the CPU 23. Also, the battery 57 is a nickel-cadmium type battery capable of charging and discharging, and is a battery having characteristics in which an output voltage at the time of full charging is 2.8 V.

The CPU 23 is constructed of ROM 45, RAM 47, a timer 49, an AD converter 51, a control circuit (not shown), etc., and a program stored in the EEPROM 41 is read out and the control circuit executes its program and thereby, control of each part of the mobile device 15 is performed. Incidentally, the CPU 23 comprises at least a port (charging stand detection port 71) for inputting an output voltage from the charging stand detection circuit 53, a port (VCC port 73) for inputting a voltage by which the CPU 23 works, a port (battery voltage port 75) for inputting an output voltage from the battery voltage detection circuit 59, and a port (trickle charging switching port 77) for outputting a voltage for switching between normal charging and trickle charging to the charging current switching circuit 55. Also, it is constructed so that a voltage inputted to the battery voltage port 75 is inputted to the AD converter 51 and is converted into a voltage value of a digital format and thereby a terminal voltage of the battery 57 can be recognized.

The antenna 27 is an antenna for communicating with the main device 13 by radio waves. In this aspect, radio waves of antenna power and a frequency permitted to a low power wireless station defined by the Radio Law are outputted.

The RF module 29 serves a function of fetching a sound signal from radio waves received by the antenna 27 based on a command from the CPU 23 and sending the sound signal to the compander 31 and also converting a sound signal sent from the compander 31 into radio waves and sending the sound signal out of the antenna 27.

The compander 31 serves a function of reducing noise so that a user becomes easy to listen to a sound signal outputted to the receiver 33 and a sound signal inputted from the microphone 35 based on a command from the CPU 23.

The receiver 33 is means for converting an electrical signal sent from the compander 31 into sound and producing an output so that a user can hear.

The microphone 35 is means for converting sound uttered by a user into an electrical signal and outputting the sound to the compander 31.

The key matrix 37 is means in which keys for detecting depression by a user and outputting an electrical signal are arranged in a matrix state.

The operation part LED 39 is an LED for illuminating each of the keys of the key matrix 37 so that a user can visually recognize the keys even in the dark.

The EEPROM 41 is programmable ROM (Electrically Erasable Programmable ROM) capable of electrically rewriting and erasing the contents of a program, and characteristic information about the battery 57, various programs executed by the CPU 23, etc. are stored.

The display part LCD 43 is a liquid crystal display with backlight for displaying various information by a command from the CPU 23. It is constructed so that this backlight switches between on and off states by the command from the CPU 23 and shifts to an off state after a lapse of 10 seconds since a user operated the key matrix 37. Also, one of information displayed by the display part LCD 43 includes the remaining amount of the battery 57. This remaining display will be described with reference to an image diagram of battery remaining display of FIGS. 5A to 5D.

Figure 5A:
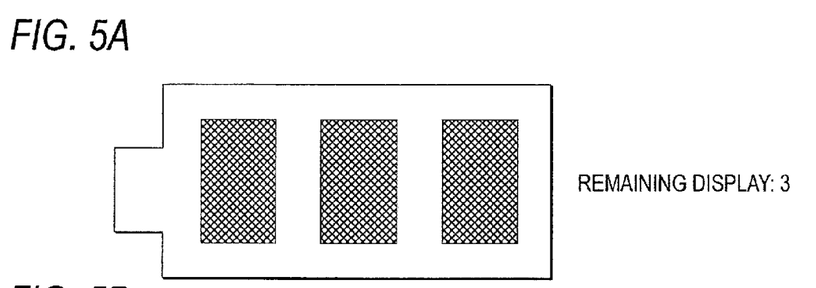
FIGS. 5A to 5D show one example of battery remaining display.

As shown in FIGS. 5A to 5D, the battery remaining display has kinds of four stages, and the case shown in FIG. 5A is the case where the remaining display is in a state of 3, that is, the battery remaining display displayed in the case where the remaining charging time (which is charging time necessary to maximize (full charging state) charging power of the battery 57 and is time stored in the RAM 47) is less than 12 hours and a terminal voltage of the battery 57 is 2.38 V or more. Incidentally, the case where this remaining display is in a state of 3 means that the remaining amount of the battery is about 30% to 100% the full charging state.

Figure 5B:
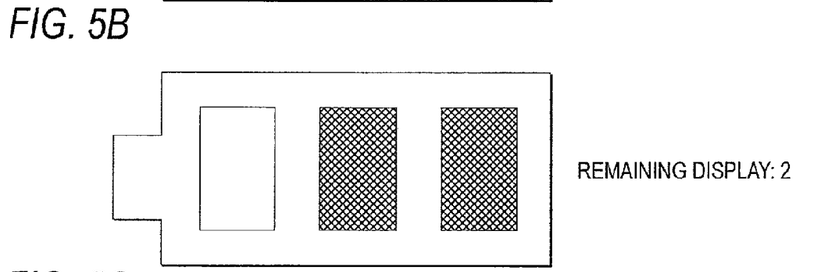

Also, the case shown in FIG. 5B is the case where the remaining display is in a state of 2, that is, the battery remaining display displayed in the case where the remaining charging time is less than 12 hours and a terminal voltage of the battery 57 is 2.35 V or more and less than 2.38 V, or the case where the remaining charging time is 12 hours or more and less than 13.5 hours and a terminal voltage of the battery 57 is 2.35 V or more. Incidentally, the case where this remaining display is in a state of 2 means that the remaining amount of the battery is about 20% to 30% the full charging state.

Figure 5C:
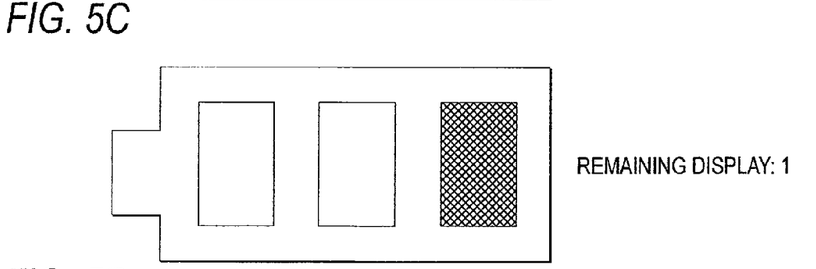

Also, the case shown in FIG. 5C is the case where the remaining display is in a state of 1, that is, the battery remaining display displayed in the case where the remaining charging time is less than 12 hours and a terminal voltage of the battery 57 is 2.30 V or more and less than 2.35 V, or the case where the remaining charging time is 12 hours or more and less than 13.5 hours and a terminal voltage of the battery 57 is 2.30 V or more and less than 2.35 V, or the case where the remaining charging time is 13.5 hours or more and a terminal voltage of the battery 57 is 2.30 V or more. Incidentally, the case where this remaining display is in a state of 1 means that the remaining amount of the battery is about 10% to 20% the full charging state.

Figure 5D:
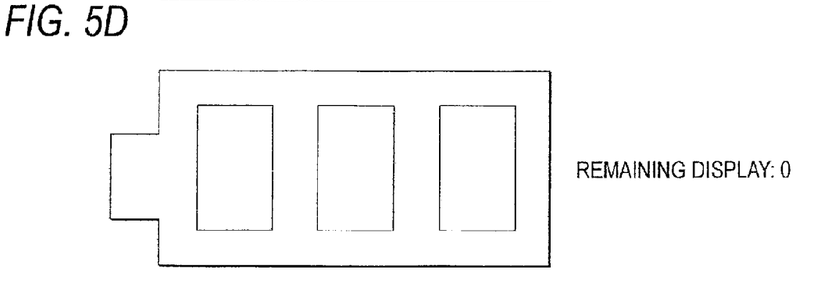

Also, the case shown in FIG. 5D is the case where the remaining display is in a state of 0, that is, the battery remaining display displayed in the case where the remaining charging time is less than 12 hours and a terminal voltage of the battery 57 is less than 2.30 V, or the case where the remaining charging time is 12 hours or more and less than 13.5 hours and a terminal voltage of the battery 57 is less than 2.30 V, or the case where the remaining charging time is 13.5 hours or more and a terminal voltage of the battery 57 is less than 2.30 V. Incidentally, the case where this remaining display is in a state of 0 means that the remaining amount of the battery is about 0% to 10% the full charging state.

Incidentally, it is constructed so that information about these conditions is stored in the EEPROM 41 as characteristic information about the battery 57 and the conditions can also be changed by rewriting the stored information.

Next, battery remaining display processing and display determination processing executed in its battery remaining display processing among various processing executed by the CPU 23 will be described. Incidentally, description of processing executed by the CPU 23 in order to implement a function served by a mobile device of a general telephone set is omitted.

(a) Battery Remaining Display Processing

First, battery remaining display processing executed by the CPU 23 will be described with reference to a flowchart of FIG. 3. The battery remaining display processing is processing in which the CPU 23 starts execution by inputting an interrupt to the CPU 23 every second by the timer 49 in the CPU 23. Incidentally, it is constructed so that the CPU 23 can end the battery remaining display processing within one second.

When the CPU 23 starts execution of the battery remaining display processing, it is first determined whether or not the mobile device 15 is placed on the charging stand 17 (S110). Specifically, it is determined that the mobile device is placed on the charging stand 17 when an output voltage from the charging stand detection circuit 53 is at a low level (S110: YES), and it is determined that it is not placed on the charging stand 17 when an output voltage from the charging stand detection circuit 53 is at a high level (S110: NO).

When it is determined that the mobile device 15 is not placed on the charging stand 17 in this S110 (S110: NO), it is then determined whether or not the mobile device 15 is in an idling state (S120). Incidentally, the "idling state" herein means the case where communication between the main device 13 and the mobile device 15 is not conducted and backlight of the display part LCD 43 and the operation part LED 39 are not turned on. Also, the case where communication between the main device 13 and the mobile device 15 is not conducted is the case where calling, incoming and speech of an extension and an outside line are not performed.

When it is determined that the mobile device 15 is in the idling state in S120 (S120: YES), 2.5×6/110 seconds are added to the remaining charging time which is information retained in the RAM 47. Incidentally, the "remaining charging time" herein is information indicating charging time necessary to maximize (full charging state) charging power of the battery 57. Also, this "remaining charging time" has an upper limit of 15 hours and is constructed so as to be initialized in the case of cutting off power supply to the CPU 23. Also, "2.5×6/110 seconds" is a value obtained by measurement or calculation.

On the other hand, when it is determined that the mobile device 15 is not in the idling state in S120 (S120: NO), 2.5 seconds are added to the remaining charging time. Then, in both cases (S120: YES, NO) after being added, processing is shifted to execution of display determination processing described below. Incidentally, "2.5 seconds" is a value obtained by measurement or calculation.

When it is determined that the mobile device 15 is placed on the charging stand 17 in S110 (S110: YES), it is then determined whether or not the remaining charging time described above is 0 (S150). When it is determined that the remaining charging time is not 0 (S150: NO), 1 second is subtracted from the remaining charging time (S160) and normal charging is turned on (S170). "Turning on normal charging" herein means that a voltage of the trickle charging switching port 77 is shifted to a high level state. By shifting the voltage of the trickle charging switching port 77 to the high level state thus, as compared with the case where a voltage is at a low level, a larger current flows through the battery 57 and charging is performed. Incidentally, after the voltage of the trickle charging switching port 77 is shifted to the high level state, it is constructed so as to keep the high level state unless an action of being shifted to a low level state is performed. After the processing of S170 is ended, the processing is advanced to S190.

On the other hand, when it is determined that the "remaining charging time" is 0 in S150 (S150: YES), the normal charging is turned off (S180). "Turning off normal charging" herein means that a voltage of the trickle charging switching port 77 is shifted to a low level state. By shifting the voltage of the trickle charging switching port 77 to the low level state thus, as compared with the case where a voltage is at a high level, a smaller current flows through the battery 57 and trickle charging is performed. Incidentally, after the voltage of the trickle charging switching port 77 is shifted to the low level state, it is constructed so as to keep the low level state unless an action of being shifted to a high level state is performed. After the processing of S180 is ended, the processing is advanced to S190.

In S190, display determination processing described below is executed and when execution of the display determination processing is ended, the present processing (battery remaining display processing) is ended. Incidentally, in the battery remaining display processing, hardware, etc., are constructed so that time ranging from a start to en end of the processing is within one second as described above.

(b) Display Determination Processing

Next, display determination processing executed by the CPU 23 will be described with reference to a flowchart of FIG. 4. The display determination processing is called and executed in S190 (see FIG. 3) of the battery remaining display processing described above.

When the CPU 23 starts execution of the display determination processing, it is first determined whether or not the remaining charging time is less than 12 hours (S210). The "remaining charging time" herein is the same as that used in the battery remaining display processing described above. When the remaining charging time is not less than 12 hours (S210: NO), it is then determined whether or not the remaining charging time is less than 13.5 hours (S240).

When it is determined that the remaining charging time is not less than 13.5 hours in this S240 (S240: NO), it is then determined whether or not a terminal voltage of the battery 57 is less than 2.30 V (S280). This determination is made by using an output value of the AD converter 51. When it is determined that the terminal voltage of the battery 57 is less than 2.30 V in this S280 (S280: YES), the battery remaining display displayed on the display part LCD 43 is set at 0 (S290) and the remaining charging time is set at 15 hours (S295). Then, the present processing (display determination processing) is ended and the processing is returned to subsequent processing of the battery remaining display processing (processing subsequent to S190 of FIG. 3). On the other hand, when it is determined that the terminal voltage of the battery 57 is not less than 2.30 V in S280 (S280: NO), the battery remaining display displayed on the display part LCD 43 is set at 1 (S285) and the present processing (display determination processing) is ended and the processing is returned to subsequent processing of the battery remaining display processing (processing subsequent to S190 of FIG. 3).

When it is determined that the remaining charging time is less than 13.5 hours in S240 (S240: YES), it is then determined whether or not the terminal voltage of the battery 57 is less than 2.35 V (S245). When it is determined that the terminal voltage of the battery 57 is not less than 2.35 V in this S245 (S245: NO), the battery remaining display displayed on the display part LCD 43 is set at 2 (S250) and the present processing (display determination processing) is ended and the processing is returned to subsequent processing of the battery remaining display processing (processing subsequent to S190 of FIG. 3).

On the other hand, when it is determined that the terminal voltage of the battery 57 is less than 2.35 V in S245 (S245: YES), it is further determined whether or not the terminal voltage of the battery 57 is less than 2.30 V (S255). When it is determined that the terminal voltage of the battery 57 is less than 2.30 V in this S255 (S255: YES), the battery remaining display displayed on the display part LCD 43 is set at 0 (S260) and the remaining charging time is set at 15 hours (S295). Then, the present processing (display determination processing) is ended and the processing is returned to subsequent processing of the battery remaining display processing (processing subsequent to S190 of FIG. 3). Also, when it is determined that the terminal voltage of the battery 57 is not less than 2.30 V in S255 (S255: NO), the battery remaining display displayed on the display part LCD 43 is set at 1 (S270) and the remaining charging time is set at 13.5 hours (S275). Then, the present processing (display determination processing) is ended and the processing is returned to subsequent processing of the battery remaining display processing (processing subsequent to S190 of FIG. 3).

When it is determined that the remaining charging time is less than 12 hours in S210 described above (S210: YES), it is then determined whether or not the terminal voltage of the battery 57 is less than 2.38 V (S215). When it is determined that the terminal voltage of the battery 57 is less than 2.38 V in this S215 (S215: YES), the battery remaining display displayed on the display part LCD 43 is set at 3 (S220) and the present processing (display determination processing) is ended and the processing is returned to subsequent processing of the battery remaining display processing (processing subsequent to S190 of FIG. 3).

On the other hand, when it is determined that the terminal voltage of the battery 57 is not less than 2.38 V in S215 (S215: NO), it is further determined whether or not the terminal voltage of the battery 57 is less than 2.35 V (S225). When it is determined that the terminal voltage of the battery 57 is less than 2.35 V in this S225 (S225: YES), the processing is advanced to S255 described above. When it is determined that the terminal voltage of the battery 57 is not less than 2.35 V (S225: NO), the battery remaining display displayed on the display part LCD 43 is set at 2 (S230) and the remaining charging time is set at 12 hours (S235). Then, the present processing (display determination processing) is ended and the processing is returned to subsequent processing of the battery remaining display processing (processing subsequent to S190 of FIG. 3).

The aspect of the invention has been described above, and effect of the aspect will be described herein.

The mobile device 15 of the aspect is constructed so as to decide the remaining display of the battery 57 displayed on the display part LCD 43 by combining both of the remaining charging time and the terminal voltage of the battery 57 (see the display determination processing (FIG. 4)). As a result of this, a problem that the terminal voltage of the battery becomes constant due to a voltage stabilization circuit at the time of charging occurring in the case of incorporating the voltage stabilization circuit and thereby a change in the terminal voltage cannot be measured and the remaining amount of the battery cannot be correctly displayed can be solved. That is, since information about the remaining charging time as well as the terminal voltage of the battery 57 is managed, the remaining display can be performed based on its information, so that the conventional problem can be solved.

Also, at the time of discharging, the remaining amount of the battery 57 is displayed by combining two pieces of information (the remaining charging time and the terminal voltage of the battery 57), so that the remaining amount of the battery 57 can be displayed more accurately as compared with the conventional case of using only one piece of information (the terminal voltage of the battery). Further, the RAM 47 disposed inside the CPU 23 is used as a circuit used for storing the remaining charging time, so that the circuit can be implemented by a smaller circuit as compared with a current stabilization circuit and upsizing of the mobile device 15 can also be suppressed.

Figure 3:
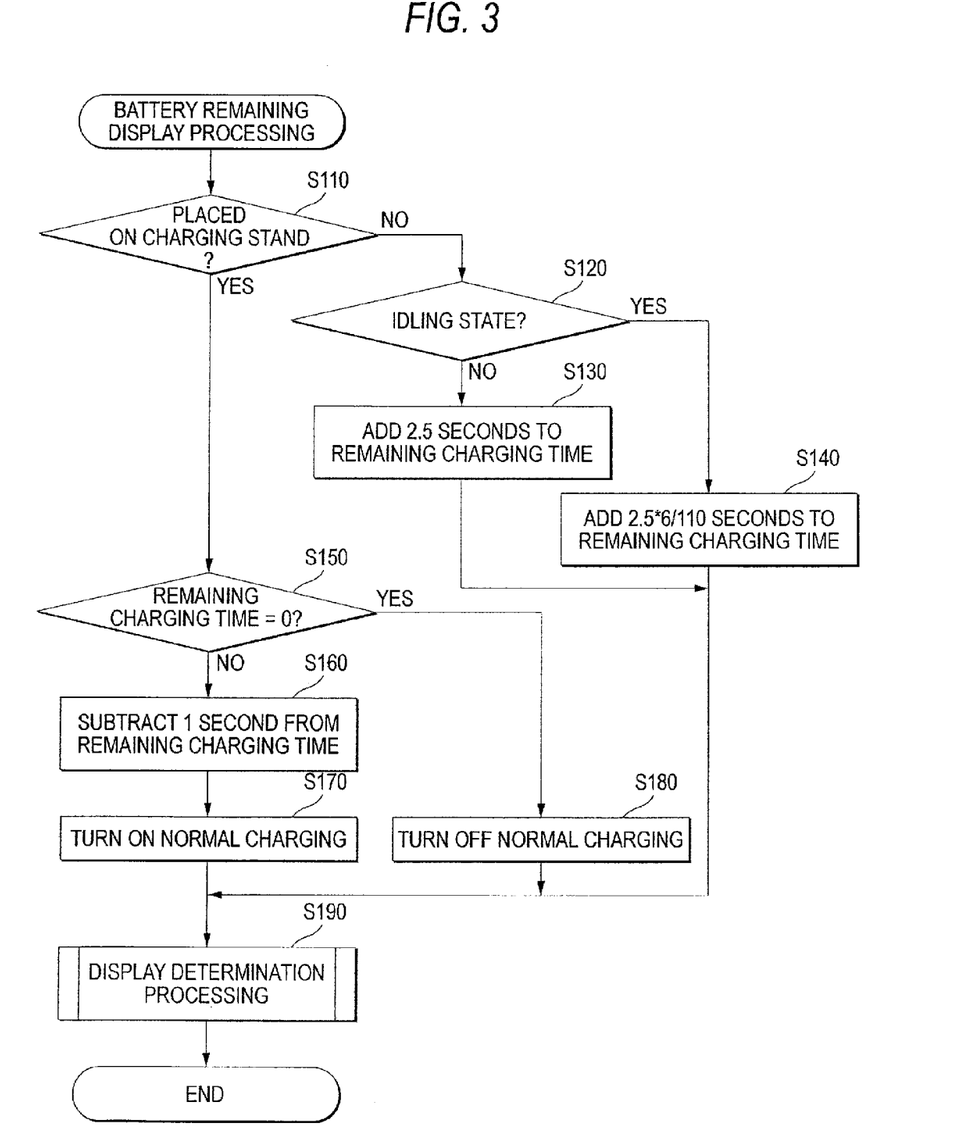
FIG. 3 is a flowchart describing battery remaining display processing.

Also, in calculation of the remaining charging time, it is determined whether or not the mobile device 15 is placed on the charging stand 17 every second (see S110 of FIG. 3), and when the mobile device 15 is not placed on the charging stand 17, it is further determined whether or not the mobile device 15 is in an idling state (see S120 of FIG. 3). Then, it is constructed so that an increase in the remaining charging time varies according to that result. That is, it is constructed so that when communication between the main device 13 and the mobile device 15 is not conducted and backlight of the display part LCD 43 and the operation part LED 39 are not turned on at the time of non-charging, the increase in the remaining charging time is decreased and otherwise, the increase in the remaining charging time is increased.

Generally, there is a large difference between an idling state and a non-idling state in power consumption. Because of this, when it is constructed so that it is determined whether or not the mobile device 15 is in the idling state and according to that result, an increase in the remaining charging time is varied as shown in the mobile device 15 of the aspect, the remaining charging time can be calculated with high accuracy. This leads to an improvement in accuracy of battery remaining display.

Also, the mobile device 15 of the aspect is constructed so that a worse result among the remaining charging time and the terminal voltage of the battery 57, that is, a state of bringing an estimation result of a smaller remaining amount of the battery is preferentially adopted and the remaining amount of the battery is displayed (see the display determination processing (FIG. 4)). For example, even when the remaining charging time is less than 12 hours, the remaining display becomes any of 0, 1, 2 and 3 depending on the terminal voltage of the battery 57. According to the experiment conducted by the inventor of the present application, more accurate result is obtained by displaying the remaining amount in this manner.

Therefore, a situation in which the remaining amount of the battery 57 becomes empty rapidly beyond user's expectation and the mobile device 15 is disabled can be avoided wherever possible as compared with the conventional case.

Figure 4:
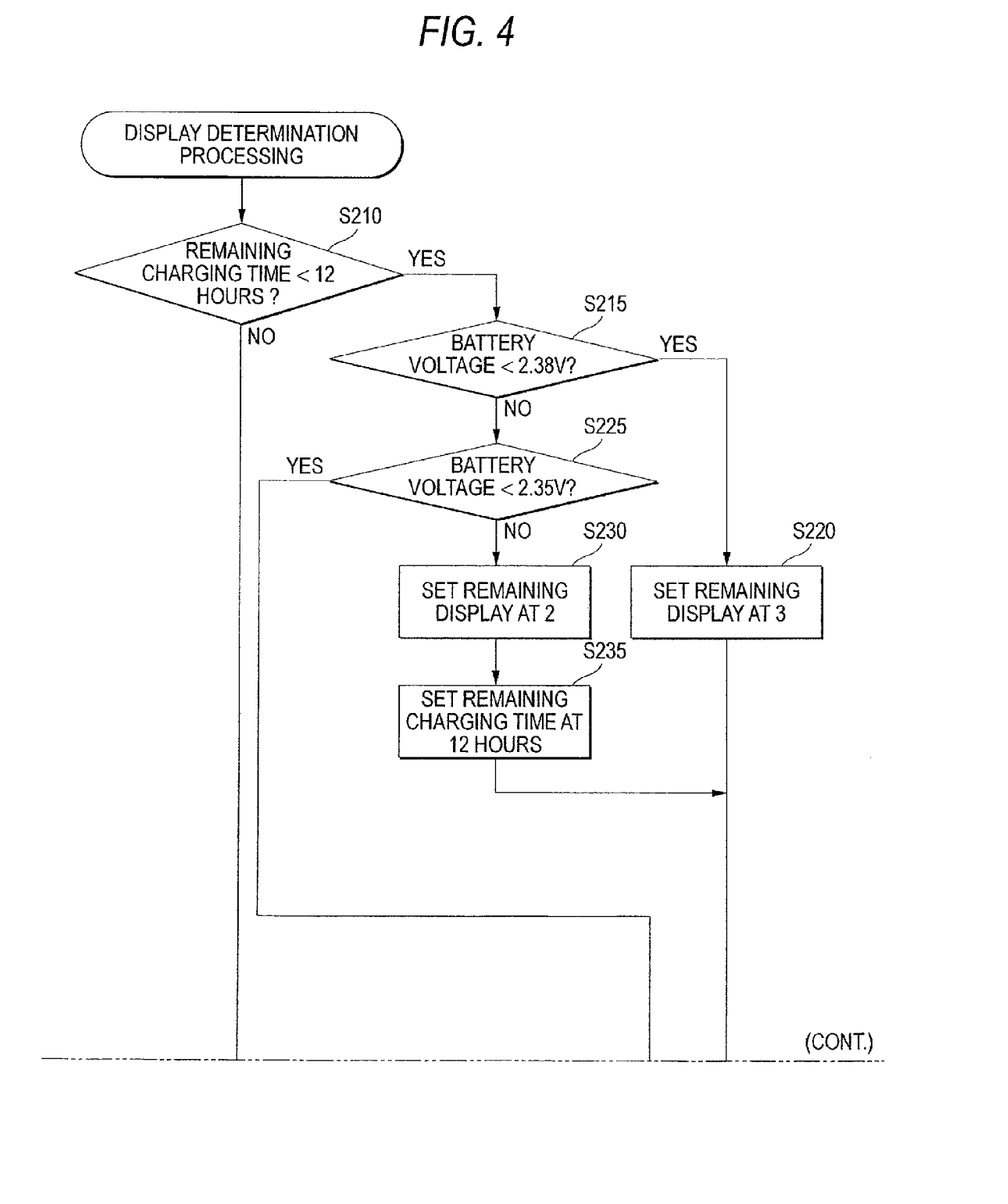
FIG. 4 is a flowchart describing display determination processing.

Also, it is constructed so that the remaining charging time is set at a fixed value according to the terminal voltage of the battery 57 in the case of satisfying a particular condition (S235, S265, S275, S295 of FIG. 4). This helps to perform accurate remaining display even when performance of the battery 57 degrades. This is because a situation in which a battery capacity decreases as compared with the original battery capacity with an increase in use time on characteristics of the battery 57 occurs but even in that case, a terminal voltage indicates a value relatively accurately proportional to the battery capacity.

By the way, when the battery can be attached to or detached from the battery remaining display apparatus, in the use history information stored by the use history storage unit, a point in time of connecting the battery is preferably used as a base point. The reason is because the case of again attaching the same battery as a detached battery is no problem but a battery different from the detached battery may be attached. In that case, the use history information stored by the use history storage unit is not information about the battery attached at present, so that the use history information becomes valueless information.

Therefore, when the use history information stored by the use history storage unit is constructed so that a point in time of connecting the battery is used as abase point, its use history information becomes information about the battery used at present and contributes to accurate battery remaining display.

Also, the use history information stored by the use history storage unit is preferably information constructed of at least charging time of the battery and discharging time of the battery or information in which at least charging time of the battery and discharging time of the battery are separately considered and generated. Incidentally, the "information constructed of charging time of the battery and discharging time of the battery" herein means that the use history information is constructed by a state in which charging time and discharging time are respectively independent (that is, charging time and discharging time are included in the use history information as they are). Also, the "information in which charging time of the battery and discharging time of the battery are separately considered and generated" means information in which charging time and discharging time are separately considered and generated in a format different from the original format (for example, power consumption, necessary charging power energy (which means power energy necessary to complete charging) or necessary charging time (which means time necessary to complete charging)).

Generally, states of changes in the remaining amount of the battery vary completely in the case of charging and the case of discharging. That is, the remaining amount of the battery increases in the case of charging, and the remaining amount of the battery decreases in the case of discharging. As a result of this, when the use history information is constructed of charging time of the battery and discharging time of the battery, the remaining amount of the battery is easy to estimate properly.

Further, the discharging time is preferably constructed of at least time in the case of standby use and time in the case of rated use assumed in the battery. "The case of rated use assumed in the battery" herein means the case of a situation in which power consumption of a power supply destination of the battery is relatively high and its state can continue for a certain degree of time. For example, when the power supply destination of the battery is a wireless apparatus and the case of satisfying the conditions described above is the case of sending radio waves, "the case of rated use assumed in the battery" can be defined as the case of sending radio waves of the wireless apparatus. Also, "the case of standby use assumed in the battery" means the case of a situation in which power consumption of a power supply destination of the battery is relatively low and its state can continue for a certain degree of time. For example, when the power supply destination of the battery is a wireless apparatus and the case of satisfying the conditions described above is the case of receiving radio waves, "the case of standby use assumed in the battery" can be defined as the case of receiving radio waves of the wireless apparatus.

Generally, there is a large difference between the case of rated use and the case of standby use assumed in the battery in power consumption of the battery, and handling the cases together causes a problem in performing accurate battery remaining display. Therefore, when the discharging time is constructed of at least time in the case of standby use and time in the case of rated use assumed in the battery, this contributes to accurate battery remaining display. Incidentally, when the use history information is information separately considered and generated by charging time and discharging time, it goes without saying that respective times in the case of standby use and the case of rated use assumed in the battery are separately considered with respect to the discharging time in the case of generating its information.

By the way, the battery remaining display apparatus further includes terminal voltage measurement unit that measures a terminal voltage of the battery, and may be constructed so that the battery remaining estimation unit estimates the remaining amount of the battery based on the terminal voltage measured by the terminal voltage measurement unit, the use history information stored by the use history storage unit and the characteristic information stored by the characteristic information storage unit. Also, the "characteristic information about the battery" in this case mainly means characteristic information about charging and discharging of the battery and concretely, for example, information about a ratio between a terminal voltage and the remaining amount of the battery or information about a ratio between a terminal voltage and necessary charging time, etc., are contemplated.

According to such a battery remaining display apparatus, the battery remaining estimation unit estimates the remaining amount of the battery using two pieces of measurement information (the terminal voltage of the battery and the use history of the battery), so that advantages of each of the of measurement information can be used and the remaining amount of the battery can be estimated more accurately as compared with the conventional case.

Incidentally, when the case of estimating the remaining amount of the battery based on the terminal voltage measured by the terminal voltage measurement unit is compared with the case of estimating the remaining amount of the battery based on the use history information stored by the use history storage unit, the case where the same estimation result is not obtained is also assumed. In this case, it is conceivable to use the average of both the results as an estimation result or preferentially use one result as an estimation result. However, the estimation result is just "estimation" and it is undeniable that some error occurs in the remaining amount of the battery. Therefore, as a result of overestimating the remaining amount of the battery, a situation in which the remaining amount of the battery becomes empty rapidly beyond user's expectation and an apparatus of a power supply destination of the battery is disabled is desirably avoided wherever possible. As a result of this, the battery remaining estimation unit could be constructed so as to use the information bringing an estimation result of a smaller remaining amount of the battery among the terminal voltage measured by the terminal voltage measurement unit and the use history information stored by the use history storage unit.

In the case of being constructed thus, as a result of overestimating the remaining amount of the battery, a situation in which the remaining amount of the battery becomes empty rapidly beyond user's expectation and an apparatus of a power supply destination of the battery is disabled can be avoided wherever possible.

Also, for reasons of degradation, etc., in performance of the battery, there is probably fear that the remaining amount of the battery is estimated inaccurately based on the use history information stored by the use history storage unit. More specifically, there is the case where the total battery capacity of the battery decreases when performance of the battery degrades. In this case, though the battery capacity decreases, there is fear that the remaining available power energy estimated from the use history information and the battery capacity before the battery capacity decreases is calculated larger than the actual power energy. On the other hand, in the terminal voltage measured by the terminal voltage measurement unit, the terminal voltage changes with respect to the remaining amount of the battery, so that the remaining available power energy can be calculated relatively accurately even when performance of the battery is degrading. Therefore, the use history storage unit could be constructed so as to correct the use history information by the terminal voltage measured by the terminal voltage measurement unit. In the case of being constructed thus, it is useful for accurate estimation of the remaining amount of the battery. Incidentally, as the correction herein, various correction methods are contemplated and, for example, the use history information is forcibly set at predetermined information when a terminal voltage exceeds a predetermined value.

Also, it is particularly useful to incorporate a wireless telephone apparatus into the battery remaining display apparatus as described above. The reason is because a situation in which the remaining amount of the battery becomes empty in a wireless telephone apparatus means that a call cannot be made immediately, so that in the wireless telephone apparatus, there is particularly great need for a user to perform proper handling (for example, a charging operation) before such a situation occurs. Incidentally, the "wireless telephone apparatus" herein may be an apparatus (so-called cellular telephone) constructed so as to implement a call by conducting direct communication between the wireless telephone apparatus and a base station etc., or may be an apparatus (so-called mobile device of fixed-line telephone) constructed so as to implement a call by conducting communication through a device having a relay function called a main device.

Subsequently, other aspects will be described.

(A) In the aspect described above, the case of applying the invention to the mobile device 15 of the wireless telephone apparatus 12 has been described, but this is one example and equipment to which the invention is applied is not limited to the mobile device of the wireless telephone apparatus. For example, the invention may be applied to a mobile device of a facsimile apparatus, a cellular telephone, a PDA, a portable notebook-sized personal computer, etc. Also in that case, similar effect can be obtained.

(B) In the aspect described above, both of the case where the mobile device 15 is placed on the charging stand 17 and the case where it is not placed on the charging stand 17 have been constructed so as to decide the remaining amount of the battery 57 displayed on the display part LCD 43 by the same display determination logic (that is, decision by the display determination processing of FIG. 4), but the remaining amount of the battery 57 displayed on the display part LCD 43 may be constructed so as to be respectively decided by separate display determination logic. Incidentally, concrete parameters (conditions of the terminal voltage and the remaining charging time) in this case could be defined by experiment etc.

When the case where the mobile device 15 is placed on the charging stand 17 and the case where it is not placed on the charging stand 17 are constructed so as to separately decide the remaining amount of the battery 57 displayed on the display part LCD 43 by the display determination logic thus, the remaining amount of the battery can be displayed more accurately. Also, at that time, the display determination logic may further be set separately in the case of normal charging and the case of trickle charging.

(C) In the display determination processing of the aspect described above, it has been constructed so as to branch processing by a value of the terminal voltage of the battery 57, but only the remaining charging time may be used as a branch condition (in that case, there is no need to use the battery voltage detection circuit 59). Concrete processing (display determination processing 2) in that case will be described below using a flowchart of FIG. 6.

The display determination processing 2 is called and executed in S190 (see FIG. 3) of the battery remaining display processing described above instead of the display determination processing described above.

Figure 6:
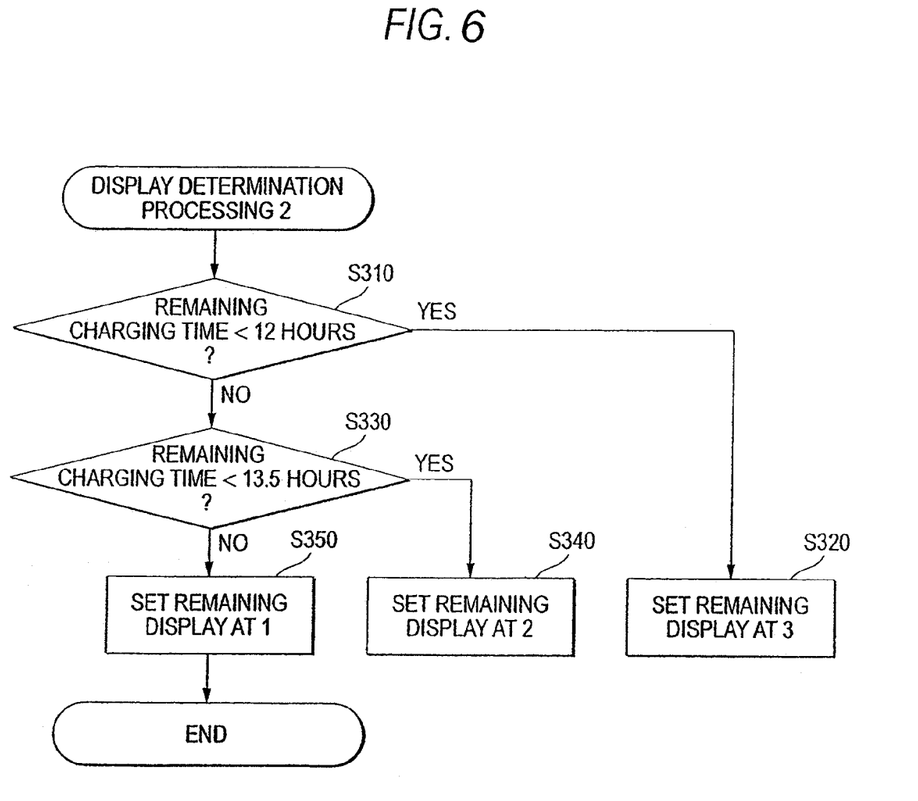
FIG. 6 is a flowchart describing display determination processing 2.

When the CPU 23 starts execution of the display determination processing 2, it is first determined whether or not the remaining charging time is less than 12 hours (S310). When the remaining charging time is less than 12 hours (S310: YES), the battery remaining display displayed on the display part LCD 43 is set at 3 (S320) and the present processing (display determination processing 2) is ended and the processing is returned to subsequent processing of the battery remaining display processing (processing subsequent to S190 of FIG. 3). On the other hand, in the case of determining that the remaining charging time is not less than 12 hours (S310: NO), it is further determined whether or not the remaining charging time is less than 13.5 hours (S330).

In the case of determining that the remaining charging time is less than 13.5 hours in this S330 (S330: YES), the battery remaining display displayed on the display part LCD 43 is set at 2 (S340) and the present processing (display determination processing 2) is ended and the processing is returned to subsequent processing of the battery remaining display processing (processing subsequent to S190 of FIG. 3). On the other hand, in the case of determining that the remaining charging time is not less than 13.5 hours (S330: NO), the battery remaining display displayed on the display part LCD 43 is set at 1 (S350) and the present processing (display determination processing 2) is ended and the processing is returned to subsequent processing of the battery remaining display processing (processing subsequent to S190 of FIG. 3).

Even in such a mobile device 15 for performing the battery remaining display using a use history of the battery, a problem which may occur in an apparatus having a voltage stabilization circuit can be avoided and the remaining amount of the battery can be displayed properly.

The battery voltage detection circuit 59 functions as a terminal voltage measurement unit, the RAM 47 functions as a use history storage unit, and the EEPROM 41 functions as a characteristic information storage unit. Also, the CPU 23 functions as a battery remaining estimation unit, and the display part LCD 43 functions as a display unit.

Also, "the remaining charging time" used in description of the aspect corresponds to "use history information". Also, "characteristic information" about the battery 57 stored in the EEPROM 41 corresponds to "characteristic information".

Also, "the idling state" used in description of the aspect corresponds to "the case of standby use", but "the case of standby use" is not limited to this idling state. A situation in which power consumption of the mobile device 15 is relatively low and its state continues for a long time could be defined as "the case of standby use". Also, "the non-idling state" corresponds to "the case of rated use", but similarly in this case, a situation in which power consumption of the mobile device 15 is relatively high and its state continues for a long time could be defined as "the case of rated use".

What is claimed is:

1. A battery remaining display apparatus comprising: a battery capable of being charged and discharged; a use history storage unit that stores use history information about the battery; a characteristic information storage unit that stores characteristic information about the battery; a battery remaining estimation unit that estimates a remaining amount of the battery based on the use history information stored by the use history storage unit and the characteristic information stored by the characteristic information storage unit; and a display unit that displays the remaining amount of the battery estimated by the battery remaining estimation unit, further comprising a terminal voltage measurement unit that measures a terminal voltage of the battery; wherein the battery remaining estimation unit estimates the remaining amount of the battery based on the terminal voltage measured by the terminal voltage measurement unit, the use history information stored by the use history storage unit and the characteristic information stored by the characteristic information storage unit.

2. The battery remaining display apparatus according to claim 1, wherein the battery is capable of being attached to or detached from the battery remaining display apparatus, and in the use history information stored by the use history storage unit, a point in time of connecting the battery is used as a base point.

3. The battery remaining display apparatus according to claim 1, wherein the use history information stored by the use history storage unit is information constructed of at least charging time of the battery and discharging time of the battery.

4. The battery remaining display apparatus according to claim 1, wherein the use history information stored by the use history storage unit is information which is created by at least separately considering charging time of the battery and discharging time of the battery.

5. The battery remaining display apparatus according to claim 3, wherein the discharging time is constructed of at least assumed time in the case of standby use and time in the case of rated use assumed in the battery.

6. The battery remaining display apparatus according to claim 4, wherein the discharging time is constructed of at least assumed time in the case of standby use and time in the case of rated use assumed in the battery.

7. The battery remaining display apparatus according to claim 1, wherein, when estimating, the battery remaining estimation unit uses one of the terminal voltage measured by the terminal voltage measurement unit and the use history information stored by the use history storage unit which makes an estimation result to be a smaller remaining amount of the battery.

8. The battery remaining display apparatus according to claim 1, wherein the use history storage unit corrects the use history information by the terminal voltage measured by the terminal voltage measurement unit.

9. A wireless telephone apparatus comprising: an antenna; and a battery remaining display apparatus that comprises: a battery capable of being charged and discharged; a terminal voltage measurement unit that measures a terminal voltage of the battery; a use history storage unit that stores use history information about the battery; a characteristic information storage unit that stores characteristic information about the battery; a battery remaining estimation unit that estimates a remaining amount of the battery, wherein the battery remaining estimation unit estimates a remaining amount of the battery based on the terminal voltage measured by the terminal voltage measurement unit and based on the use history information stored by the use history storage unit and the characteristic information stored by the characteristic information storage unit; and a display unit that displays the remaining amount of the battery estimated by the battery remaining estimation unit.

* * * * *